United States Patent
Simony (10) Patent No.: US 12,401,370 B2
(45) Date of Patent: Aug. 26, 2025

(54) DIGITAL TO ANALOG CONVERTER

(71) Applicant: STMicroelectronics (Grenoble 2) SAS, Grenoble (FR)

(72) Inventor: Laurent Simony, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 42 days.

(21) Appl. No.: 18/314,529

(22) Filed: May 9, 2023

(65) Prior Publication Data

US 2023/0403019 A1    Dec. 14, 2023

(30) Foreign Application Priority Data

May 20, 2022    (FR) ...................................... 2204819

(51) Int. Cl.
*H03M 1/08* (2006.01)
*H04N 25/70* (2023.01)

(52) U.S. Cl.
CPC .......... *H03M 1/0845* (2013.01); *H04N 25/70* (2023.01)

(58) Field of Classification Search
CPC ...... H03M 1/0845; H03M 1/56; H04N 25/70; H03K 4/56; H03K 4/026
See application file for complete search history.

(56) References Cited

U.S. PATENT DOCUMENTS

| | | | |
|---|---|---|---|
| 2015/0076325 A1* | 3/2015 | Higuchi ................... | H03K 4/90 327/134 |
| 2016/0315602 A1* | 10/2016 | Sohn ........................ | H03K 4/56 |
| 2017/0359077 A1* | 12/2017 | Dempsey ................ | H03M 1/70 |

OTHER PUBLICATIONS

Hao Meng et al., "A simple ramp generator with level spreading for SEIR based ADC BIST circuit," 2015 IEEE, 58th International Midwest Symposium on Circuits and Systems (MWSCAS), IEEE, Aug. 2, 2015, pp. 1-4, XP033218736.

* cited by examiner

*Primary Examiner* — Yogesh K Aggarwal
(74) *Attorney, Agent, or Firm* — Slater Matsil, LLP (57) ABSTRACT

In an embodiment a digital-to-analog converter includes a plurality of first capacitors, each having a first electrode and a second electrode, wherein the second electrodes are connected together and are connected to an inverting input of a first amplifier stage having its non-inverting input coupled to ground, a plurality of first switches, each of the first capacitors having its first electrode connected to a corresponding one of the first switches, wherein each of the first switches is configured to occupy a first state where the first electrode of a corresponding first capacitor is coupled to a first reference voltage and occupy a second state where the first electrode of the corresponding first capacitor is coupled to a second reference voltage different from the first reference voltage, a capacitive feedback circuit connected between the inverting input and an output of the first amplifier stage, the capacitive feedback circuit including at least one second capacitor and a controller.

20 Claims, 7 Drawing Sheets

DIGITAL TO ANALOG CONVERTER

CROSS-REFERENCE TO RELATED APPLICATIONS

This application claims priority to French patent application number FR2204819, filed on May 20, 2022, entitled "Convertisseur numerique-analogique" which is hereby incorporated herein by reference in its entirety.

TECHNICAL FIELD

The present disclosure generally concerns voltage ramp generators and the associated voltage ramp generation methods, particularly voltage ramp generators used in the analog-to-digital converters of image sensors.

BACKGROUND

Voltage ramp generators, particularly those powering ramp-type analog-to-digital converters in image sensors, are submitted to strict specifications, particularly in terms of noise, in terms of power supply voltage rejection ratio, or also in terms of non-linearity with respect to an ideal ramp. For example, for certain applications, it is desirable to obtain a relatively low line noise. Indeed, the use of steering current digital-to-analog converters (DAC) results in switching current sources of various sizes. Thus, in existing solutions, glitches are of variable amplitudes according to the switchings. It thus is a non-regular phenomenon, likely to create a differential non-linearity which would degrade the sensor performance. Further, it would be desirable for the power consumption of existing solutions to be decreased to reach the expected requirements, especially for image sensors.

SUMMARY

Embodiments provide a digital-to-analog converter having a better performance than existing solutions which require high currents, a high voltage, and a boost converter. Other embodiments provide a desired noise level by powering the ramp generator under the 1.8-V nominal voltage of the targeted technology, for example, silicon-on-insulator (SOI) for the voltage resistance. Yet other embodiments overcome all or part of the disadvantages of known digital-to-analog converters.

An embodiment provides a digital-to-analog converter comprising:
a plurality of first capacitors, each having a first and a second electrode, the second electrodes being connected together and to the inverting input of a first amplifier stage having its non-inverting input coupled to a ground plane;
a plurality of first switches, each of the first capacitors having its first electrode connected to a corresponding one of said first switches in the plurality;
each of the first switches being capable of occupying:
a first state where the first electrode of the corresponding capacitor is coupled to a first reference voltage; and,
a second state where the first electrode of the corresponding capacitor is coupled to a second reference voltage different from the first reference voltage;
a capacitive feedback circuit, connected between the inverting input and the output of the first amplifier stage, and comprising at least one capacitor; and
a controller configured to control the plurality of first switches to modify the charge accumulated in said feedback circuit and thus generate a sequence comprising one or a plurality of voltage ramps and/or one or a plurality of voltage jumps at the output of the first amplifier stage.

Another embodiment provides a method of generation of a sequence comprising one or a plurality of voltage ramps and/or one or a plurality of voltage jumps, the method comprising:
controlling, with a controller, a plurality of first switches of a digital-to-analog converter comprising a plurality of capacitors, each having a first and a second electrodes, the second electrodes being connected together and to the inverting input of a first amplifier stage having its non-inverting input coupled to ground, each of the first capacitors having its first electrode connected to a corresponding one of said first switches in the plurality, each of the first switches being capable of occupying:
a first state where the first electrode of the corresponding capacitor is coupled to a first reference voltage; and,
a second state where the first electrode of the corresponding capacitor is coupled to a second reference voltage different from the first reference voltage;
the digital-to-analog converter comprising a capacitive feedback circuit, which comprises at least one capacitor, connected between the inverting input and the output of the first amplifier stage,
the switches being controlled to modify the charge accumulated in said feedback circuit and thus generate said sequence at the output of the first amplifier stage of the digital-to-analog converter.

According to an embodiment, the circuit for resetting the first capacitors is connected to the inverting input and to the output of the first amplifier stage;
the reset circuit comprising a switch connected to the inverting input of the first amplifier stage;
the output of the first amplifier stage being controlled by a reset voltage value when the switch of the reset circuit is on.

According to an embodiment, the switch of the reset circuit is further connected to the output of a second amplifier, the reset voltage is a third reference voltage applied at the input of the second amplifier, and the inverting input of the second amplifier is connected to the output of the first amplifier stage.

According to an embodiment, the switches are controlled one after the others to progressively modify the charge accumulated at the level of said capacitive feedback circuit and thus generate a voltage ramp of the sequence.

According to an embodiment, the controller comprises one or a plurality of shift registers to control the plurality of first switches.

According to an embodiment, the controller is configured to simultaneously control a plurality of the first switches to generate a voltage jump at the output of the first amplifier stage.

According to an embodiment, the digital-to-analog converter comprises a number of said first capacitors greater than or equal to $2^n$, where n is an integer greater than or equal to 6.

According to an embodiment, the first capacitors have an equal or approximately equal capacitance.

According to an embodiment, the controller is configured to select the relative levels of the first and second reference voltages in order to select a positive slope or a negative slope of said voltage ramp(s) of the sequence.

According to an embodiment, the controller further comprises addressing means for programmably controlling the plurality of first switches.

Another embodiment provides an image sensor comprising:
a pixel array; and
at least such a digital-to-analog converter, the digital-to-analog converter being coupled to at least one pixel comparator.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures. The control node of a transistor corresponds, in the case of a MOS transistor, to its gate. The main conduction nodes of a transistor correspond, in the case of a MOS transistor, to the source and to the drain of the transistor. In other types of transistor, such as bipolar transistors, the control node corresponds to the base and the main conduction nodes correspond to the emitter and to the collector.

Unless specified otherwise, the expressions "around", "approximately", "substantially" and "in the order of" signify within 10%, and preferably within 5%.

Figure 1:
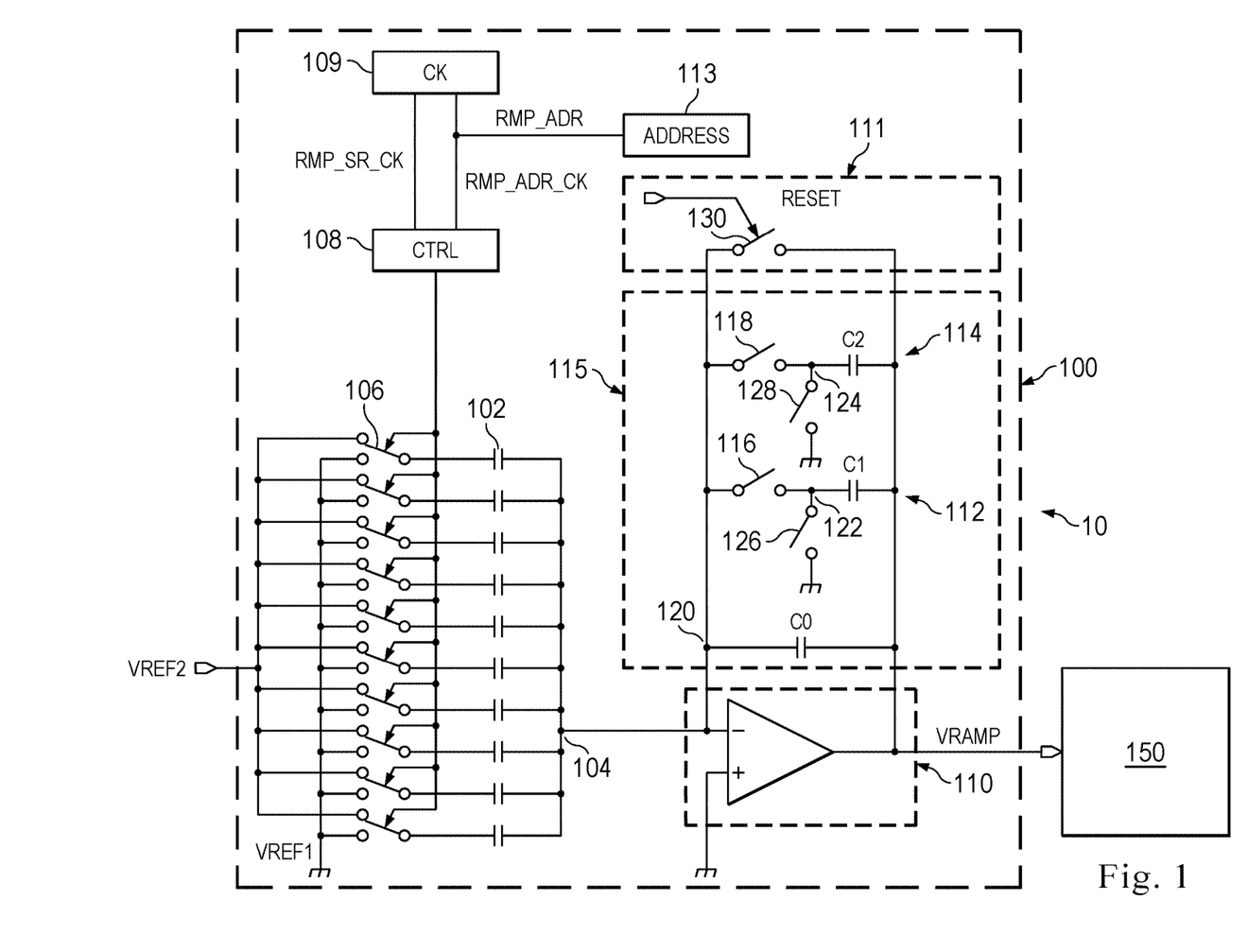
FIG. 1 schematically shows an image sensor comprising a digital-to-analog converter powering a pixel array according to an embodiment of the present disclosure.

FIG. 1 schematically shows an electronic device, for example, an image sensor 10 according to an embodiment of the present disclosure. Image sensor 10 comprises a digital-to-analog converter 100 having an output voltage VRAMP, and a pixel array 150 coupled to an output of generator 100. In another example where the device is not an image sensor, the element bearing reference number 150 is for example a load to be powered with a voltage ramp. Pixel array 150 is for example associated with ramp-type analog-to-digital converters (not illustrated) configured to convert, by means of voltage ramp VRAMP, analog voltage levels of the pixels into digital values. In other embodiments, converter 100 might deliver voltage ramp VRAMP to other types of circuits, which comprise or not ramp-type converters.

According to the example of FIG. 1, converter 100 comprises, for example, a plurality of capacitors 102. The number of these capacitors 102 is for example greater than or equal to $2^n$, where n is an integer greater than or equal to 6. According to an example, n is equal to 8 plus a margin. According to an example, the capacitance value of each of these capacitors 102 is for example identical or approximately identical to one another. In other embodiments, it would also be possible for the capacitance values to be different from one another.

Each of capacitors 102 has a first and a second electrode. The second electrodes are for example all coupled, preferably connected, together at the level of a node 104. Node 104 is for example coupled, preferably connected, to the inverting input of an amplifier stage 110 of digital-to-analog converter 100. The non-inverting input of amplifier stage 110 is for example coupled to ground, which is noise-free.

Digital-to-analog converter 100 further comprises, for example, a plurality of switches 106. According to the example of FIG. 1, each of capacitors 102 has, for example, its first electrode coupled, preferably connected, to a corresponding switch 106. According to the example of FIG. 1, each of switches 106 is capable of occupying: a first state where the first electrode of the corresponding capacitor 102 is coupled, preferably connected, to first reference voltage VREF1; and a second state where the first electrode of the corresponding capacitor 102 is coupled, preferably connected, to a second reference voltage VREF2. Second reference voltage VREF2 is different from first reference voltage VREF1. In the example of FIG. 1, VREF1 is the ground voltage and VREF2 is a positive voltage. In other examples, the functions of VREF1 and VREF2 may be inverted. Switches 106 comprise, for example, two paths in parallel, one of these paths being coupled to VREF1 and the other path being coupled to VREF2. In an example of implementation, one of the paths of each switch 106 comprises a transistor driving the current flow between the corresponding capacitor 102 and voltage VREF1. In this example, the other path of each switch 106 comprises another transistor driving the current flow between the corresponding capacitor 102 and voltage VREF2. The control signal driving the current flow is for example opposite between the two transistors.

Switches 106 are configured to be for example controlled by a controller 108 (CTRL). Controller 108 further receives for example an address synchronization signal RMP_ADR_CK, and a voltage ramp synchronization signal RMP_SR_CK, originating from a clock generator 109 (CK). Controller 108 is for example a finite state machine comprising, in certain cases, a shift register. Controller 108 is for example configured to control, at a rate determined by the clock signal generated by generator 109, the switching of switches 106 according to a defined sequence. This enables to progressively transfer, at each switching, an additional charge to progressively modify the total charge stored at the level of a capacitive feedback circuit 115 and to thus generate voltage ramp VRAMP. For example, each switch is associated with a corresponding address, and when one of the addresses is selected by controller 108, all the switches having an address lower than the selected address are controlled to be in one of the states, for example, the first state, and all the switches having an address equal to or greater than the selected address are controlled to be in the other state, for example, the second state.

Controller 108 receives, for example, an external address RMP_ADR delivered by an address generator 113 (ADDRESS) enabling to obtain a voltage jump.

According to the example of FIG. 1, digital-to-analog converter 100 further comprises, for example, a circuit 111 for resetting capacitors 102, which is connected between the inverting input and the output of amplifier stage 110. Reset circuit 111 is configured to start back from an initial state determined at the beginning of the sequence, where the sequence comprises one or a plurality of voltage ramps and/or one or a plurality of voltage jumps. Reset circuit 111 for example comprises a switch 130 controlled by a signal RESET, and connected, for example, on the one hand to the inverting input and on the other hand to the output of amplifier stage 110.

According to the example of FIG. 1, the capacitive feedback circuit 115 of digital-to-analog converter 100 is coupled, preferably connected, between the inverting input and the output of amplifier stage 110. The capacitance CFB of capacitive feedback circuit 115 may be either fixed, or adjustable. In an example of this capacitance, a capacitor C0 couples the output to the inverting input of amplifier stage 110. According to the example of FIG. 1, capacitive feedback circuit 115 further comprises two branches 112, 114 connected in parallel with capacitor C0. The two branches are an example illustrating the possibility of adjusting the total capacitance of capacitive feedback circuit 115. Thus, branch 112 comprises a capacitor C1 having an electrode connected to the output of amplifier stage 110, and having its other electrode coupled, via a switch 116, to the inverting input of amplifier stage 110. Another switch 126 is for example connected between the ground and the electrode of capacitor C1 which is connected to switch 116 to allow a short-circuiting of capacitor C1 in combination with switch 116, switches 126 and 116 being in opposite conduction states. Similarly, branch 114 comprises a capacitor C2 having an electrode connected to the output of amplifier stage 110, and having its other electrode coupled, via a switch 118, to the inverting input of amplifier stage 110. Another switch 128 is for example connected between the ground and the electrode of capacitor C1 which is connected to switch 118 to allow a short-circuiting of capacitor C2 in combination with switch 118.

According to an example not illustrated in FIG. 1, one or a plurality of additional branches, similar to branches 112, 114, are present between the output and the inverting input of the amplifier stage. According to another example not illustrated in FIG. 1, one or the other of branches 112, 114 is not present, or none of the two branches 112, 114 is present, and in this last case reset switch 130 is then alone in parallel with capacitor C0. Value CFB thus corresponds, in the example of FIG. 1, to the cumulated capacitance of capacitor C0 and of the possible capacitors C1 and C2 present in branches 112, 114 of capacitive feedback circuit 115 when switches 126, 128 are in the on state and switch 130 is in the off state. This capacitance CFB may be modified by deactivating one and/or the other of branches 112, 114 or by adding other branches similar to branches 112 or 114.

Switches 126 and 128 enable, when they are controlled to their on state and when switches 116, 118, and 130 are off, to set back the capacitor of the corresponding branch to ground. This enables not to leave the capacitive elements of the feedback circuit floating. It would also be possible to envisage an arrangement of circuit 115 where the capacitors may be shorted on themselves.

The charge transferred at each switching of one of capacitors 102, equal to $(VREF2-VREF1)*C_i$, accumulates at the level of capacitive element CFB of capacitive feedback circuit 115, thus creating an output voltage variation VRAMP equal to $(VREF2-VREF1)*(C_i/CFB)$. Value $C_i$ is the unit capacitance of each capacitor 102 having its corresponding switch 106 switched to the second state, and thus couples the corresponding capacitor 102 to second reference voltage VREF2. Value CFB is the capacitance of capacitive feedback circuit 115. The voltage at the level of output VRAMP of amplifier 110 increases or decreases incrementally, along the switchings of switches 106, by value $(VREF2-VREF1)*(C_i/CFB)$. At each switching of a switch 106, a voltage step is created. In an example, a subsequent filtering, for example due to amplifier 110, "smoothes" these ramp steps. For example, these voltage steps are filtered by the passband of amplifier stage 110. This filtering enables to obtain an even voltage ramp. To change the direction of the voltage ramp, controller 108 inverts, either VREF1 and VREF2, or the order in which switches 106 are maneuvered. Output voltage VRAMP depends on the charge accumulated at the level of the feedback circuit but also on the initial voltage obtained at the time of the resetting of capacitors 102 by reset circuit 111. A ramp can be obtained, for example, if switches 106 are switched at a fixed rate, all the switches switching from a first position identical for all to a second position identical for all. The obtained ramp is formed by a succession of steps of low height.

In operation, voltage VREF2 is for example a positive voltage greater than voltage VREF1, and controller 108 controls, for example, switches 106 progressively to generate a voltage ramp at the output of amplifier stage 110. In another example, controller 108 controls a plurality of switches 106 simultaneously to generate a voltage jump at the output of amplifier stage 110.

In an example, voltage ramp VRAMP is a falling ramp. In this case, controller 108 is configured to control switches 106 to progressively increase (or decrease according to the definition of the charge) the charge cumulated at the level of capacitive feedback circuit 115. In the case where capacitors 102 all have the same capacitance, or substantially the same capacitance, the charge increase is linear. For example, initially, all switches 106 are in the first state, and controller 108 is configured to switch them, one after the other, to the second state, until the desired low voltage is obtained at the end of the ramp.

In another example, voltage ramp VRAMP is a rising ramp. In this case, controller 108 is configured to control switches 106 to progressively modify the charge cumulated in the capacitive elements of capacitive feedback circuit 115. In the case where capacitors 102 all have the same capacitance, or substantially the same capacitance, the decrease in the cumulated charge is obtained by progressively decreasing the number of the switches in the second state. For example, initially, all switches are in the second state, and controller 108 is configured to switch them, one after the other, to the first state, until the desired high voltage VRAMP is obtained at the end of the ramp.

The slope of the ramp can be modified, either by increasing or by decreasing the number of branches in capacitive feedback circuit 115, or by modifying the second reference voltage VREF2 or the first reference voltage VREF1, or by modifying the number of switches 106 activated at each modification by controller 108, for example, by switching the switches, two or three at a time.

According to an example of operation, a reset phase is implemented before the beginning of the voltage ramp generation. This reset phase is implemented when reset switch 130 is controlled to an on state. The voltage through capacitor C0 is then taken back to zero.

The digital-to-analog converter 100 of FIG. 1 for example enables to obtain a low noise density. It also enables to obtain a linearity with less switching noise as compared with technologies such as, for example, steering current digital-to-analog converters (DAC). Further, the current DC level is decorrelated from the high level of the generated voltage ramp, which is not possible in the case of a steering current DAC solution.

Figure 2A:
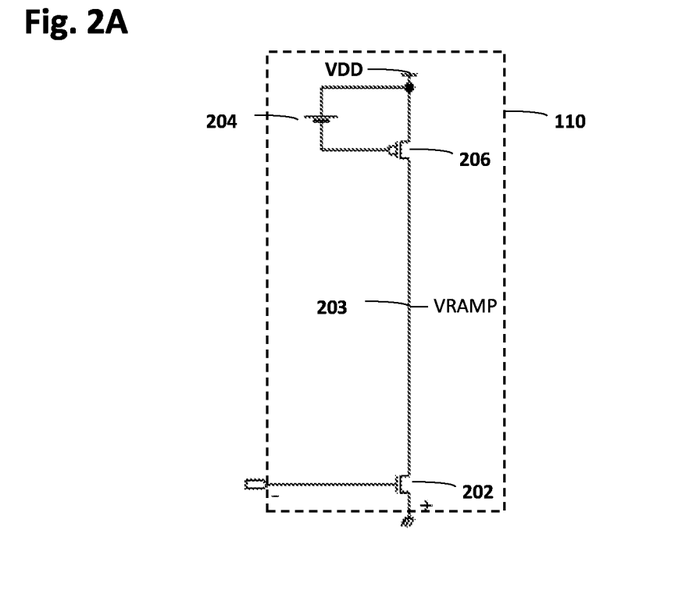
FIG. 2A schematically shows an amplifier of the digital-to-analog converter of FIG. 1, in detailed fashion, according to an embodiment of the present disclosure.

FIG. 2A schematically shows the amplifier stage 110 of the digital-to-analog converter of FIG. 1, in detailed fashion, according to an embodiment of the present disclosure. Amplifier stage 110 for example comprises an amplification circuit and a current source circuit.

In the example of FIG. 2A, the inverting input of amplifier stage 110 is represented by sign "-". According to this example, amplifier stage 110 comprises a transistor 202 assembled in common source, having its source coupled to ground, which replaces the non-inverting input of amplifier 110. Transistor 202 has its drain coupled to the output 203 delivering voltage VRAMP. A control node of transistor 202 is coupled to the inverting input of amplifier stage 110. Transistor 202 has an amplifier role. Transistor 202 is for example an NMOS-type transistor.

Amplifier stage 110 further comprises another transistor 206 configured to form a current source to bias amplifier stage 110. According to the example of FIG. 2A, a control node of transistor 206 is biased by a voltage source 204, which is further coupled to power supply voltage rail VDD and to the main conduction node of transistor 206. Another main conduction node of transistor 206 is coupled to output 203. Transistor 206 is for example a PMOS-type transistor.

Figure 2B:
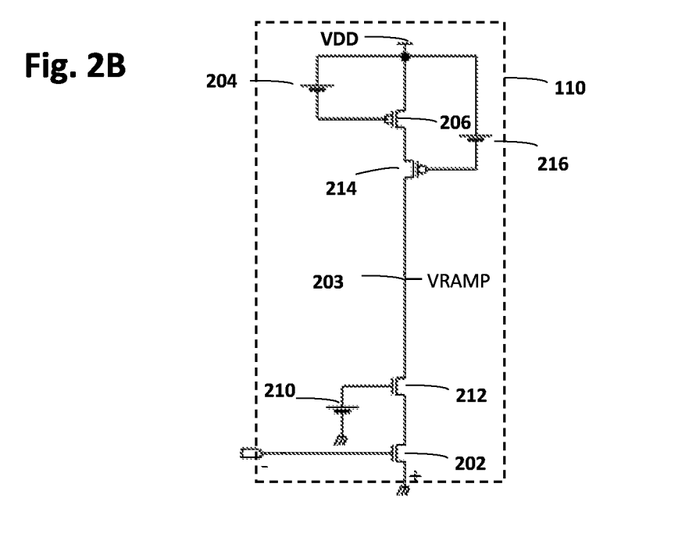
FIG. 2B schematically shows the amplifier of the digital-to-analog converter of FIG. 1, in detailed fashion, according to another embodiment of the present disclosure.

FIG. 2B schematically shows the amplifier stage 110 of the digital-to-analog converter of FIG. 1, in detailed fashion, according to another embodiment of the present disclosure. The amplifier stage 110 of FIG. 2B comprises transistors 202 and 206 as well as voltage source 204, which are similar to those of FIG. 2A.

According to the example of FIG. 2B, an additional transistor 212 is arranged to form a passive cascode assembly. Transistor 212 has its drain coupled to output 203 and its source coupled to the drain of transistor 202. A control node of transistor 212 is biased by a voltage source 210. Transistor 212 thus controls the drain voltage of transistor 202.

According to the example of FIG. 2B, an additional transistor 214 is for example arranged to make approximately constant the voltage at the level of the main conduction node forming the drain of transistor 206 and to isolate, in terms of noise or of voltage variation, the transistor 206 from output VRAMP. Transistor 214 is for example arranged in a cascode assembly. Transistor 214 has its drain coupled to output 203 and its source coupled to the drain of transistor 206. A control node of transistor 214 is biased by a voltage source 216. Transistor 214 thus controls the drain voltage of transistor 206.

The example of FIG. 2B enables, due to the use of cascode transistors, to obtain an output impedance increased with respect to the example of FIG. 2A, as well as a higher electric gain and an error reduction due to the gain as well as an improvement of the linearity.

Figure 2C:
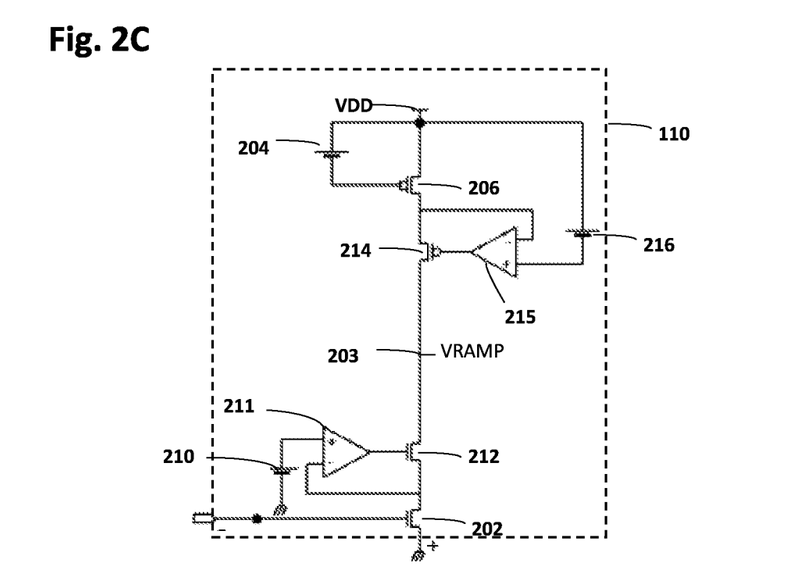
FIG. 2C schematically shows the amplifier of the digital-to-analog converter of FIG. 1, in detailed fashion, according to still another embodiment of the present disclosure.

FIG. 2C schematically shows the amplifier stage no of the digital-to-analog converter of FIG. 1, in detailed fashion, according to still another embodiment of the present disclosure. The amplifier stage 110 of FIG. 2C comprises transistors 202, 206, 212, and 214 as well as voltage sources 204, 216, and 210, which are similar to those of FIG. 2B. According to the example of FIG. 2C, the respective bias voltage of the control nodes of transistors 212 and 214 is controlled in such a way that the current in these transistors 212 and 214 is independent from the variations of output voltage VRAMP. According to an example of control, the output of an operational amplifier 211 is for example coupled to the control node of transistor 212. According to the example of FIG. 2C, the non-inverting input of operational amplifier 211 is for example coupled to voltage source 210. The inverting input of amplifier 211 is for example coupled to the common node between the main conduction nodes of transistors 212 and 202. According to an example of control, the output of an operational amplifier 215 is for example coupled to the control node of transistor 214. According to the example of FIG. 2C, the non-inverting input of operational amplifier 215 is for example coupled to voltage source 216. The inverting input of amplifier 215 is for example coupled to the common node between the main conduction nodes of transistors 206 and 214. This assembly enables for the drain voltage of the common-source transistors to be controlled, and for the current in these transistors to become independent from the variations of output VRAMP.

Figure 3:
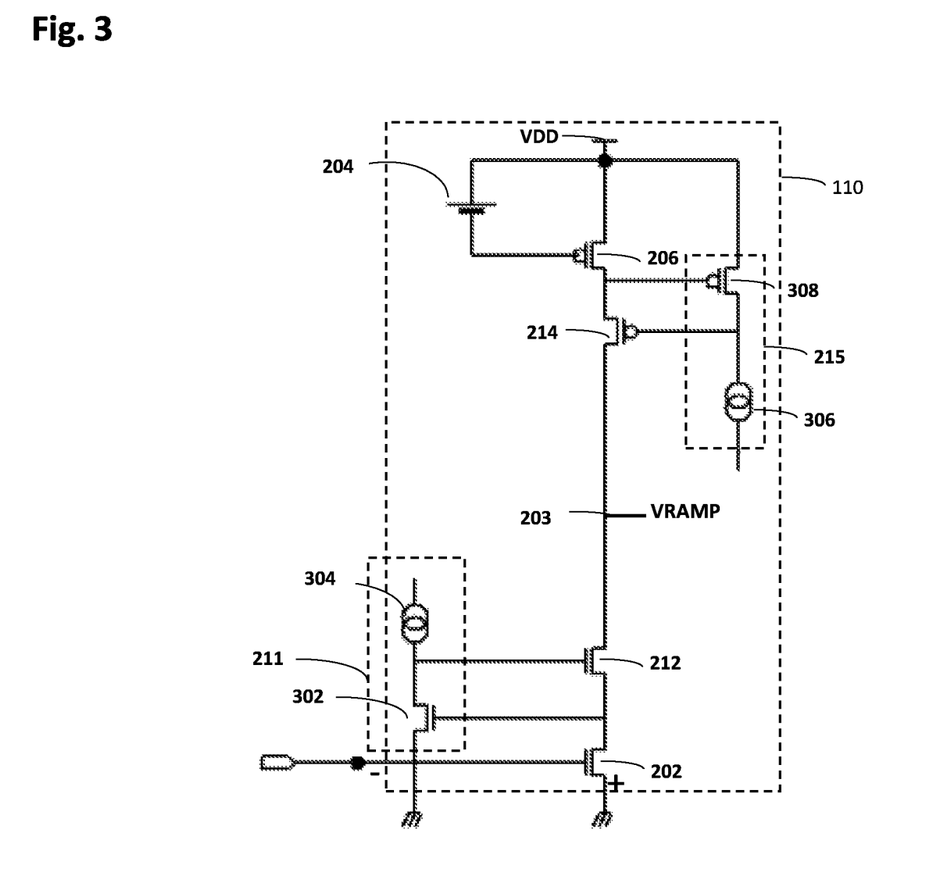
FIG. 3 schematically shows the amplifier of the digital-to-analog converter of FIG. 1, in detailed fashion, according to still another embodiment of the present disclosure.

FIG. 3 schematically shows the amplifier stage 110 of FIG. 2C, in detailed fashion, according to an embodiment of the present disclosure.

The amplifier stage 110 of FIG. 3 comprises transistors 202, 206, 212, and 214 as well as voltage source 204, which are similar to those of FIG. 2C. The example of FIG. 3 illustrates an embodiment of the amplifiers 211 and 215 of FIG. 2C. Amplifier 211 comprises, for example, a transistor 202 having a main conduction node coupled to a current source 304, and the other coupled to ground. A control node of transistor 302 is coupled to the common node between the main conduction nodes of transistors 202 and 212. Operational amplifier 215 for example comprises a transistor 308 having a main conduction terminal coupled to a current source 306 and the other coupled to power supply rail VDD. A control node of transistor 308 is coupled to the common node between the main conduction nodes of transistors 206 and 214. This assembly enables to simply form the servo systems 211, 215 of FIG. 2C.

Figure 4:
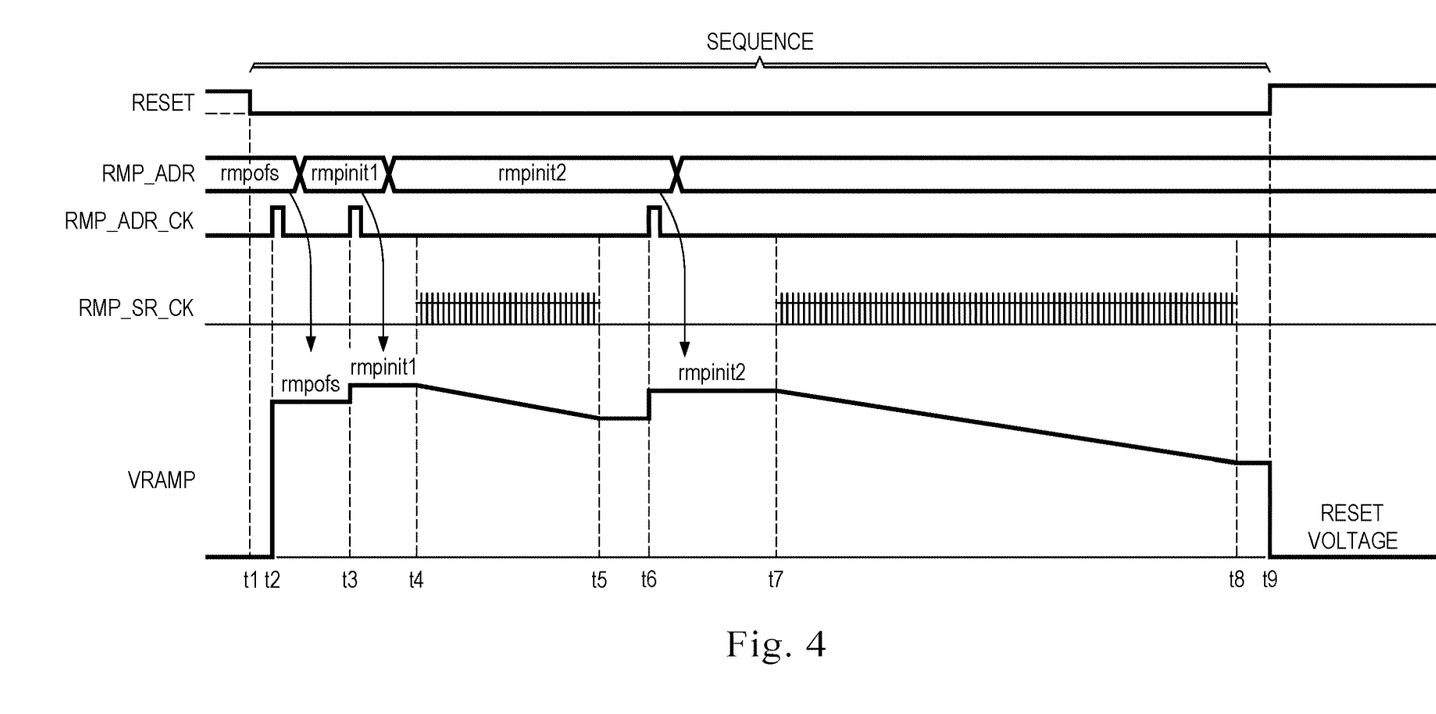
FIG. 4 is a flowchart illustrating examples of signals for the implementation of the generation of ramps and of voltage jumps with the digital-to-analog converter of FIGS. 1 to 3.

FIG. 4 is a timing diagram illustrating examples of signals for the implementation of the voltage ramp generation, for example with the voltage ramp generators of FIGS. 1 to 3. FIG. 4 shows in particular examples of signal RESET, of address signal RMP_ADR, of address synchronization signal RMP_ADR_CK, of voltage ramp synchronization signal RMP_SR_CK, and of voltage VRAMP.

A first reset phase of capacitors C0, C1, C2 occurs between times t1 and t2. In this phase, switch 130 is first set to the on state until time t1. This enables to impose a predetermined voltage level on output VRAMP. Address generator 113 generates, as an address signal RMP_ADR, a first address value rmpofs, which is for example in the form of a digital code. The address is applied at the input of controller 108. A second reset phase occurs from time t2 when clock generator 109 sends, as an address synchronization signal RMP_ADR_CK, an address enable pulse. In this second phase, capacitors 102 are reset by means of switches 106. Address value rmpofs indicates the desired level of variation of voltage VRAMP at the controller output. This sets the controller to a state where output voltage VRAMP is at a level corresponding to the controller output, starting from the voltage obtained at time t1.

At a time t3, clock generator 109 sends, as an address synchronization signal RMP_ADR_CK, another address enable pulse so that the controller is in a state where the output voltage of amplifier stage 110 is at a voltage level corresponding to an address value rmpinit1 greater than the voltage level corresponding to value rmpofs. This enables, in the case of an image sensor, to initially switch columns comparators linked to the array pixels, to a deterministic state. They will then switch back to the inverse state when the ramp will cross again the voltage level corresponding to value rmpofs in the falling direction.

According to the example of FIG. 4, a first voltage ramp is generated between times t4 and t5, and a second voltage ramp is generated between times t7 and t8. The first voltage ramp is for example used for the conversion of a reference voltage present in a pixel, and the second voltage ramp is for example used for the conversion of a signal voltage present in the pixel, according to a CDS ("Correlated Double Sampling") method.

Between times t4 and t5, clock pulses of the voltage ramp synchronization signal RMP_SR_CK sent to controller 108, and for example originating from a shift register or from an address system, impose to controller 108 to drive switches 106 progressively according to the sign of the desired slope and to the arrival level of the voltage ramp thus generated. For example, at each strike of this clock, a different switch 106 is switched from one state to another.

At a time t6, clock generator 109 sends, as an address synchronization signal RMP_ADR_CK, another address enable pulse so that controller 108 is in a state where the output voltage of amplifier stage 110 is at a voltage level corresponding to an address value rmpinit2 of address signal RMP_ADR. The voltage level corresponding to address value rmpinit2 is for example equal to the voltage level corresponding to address rmpinit1. At time t7, new pulses of voltage ramp synchronization signal RMP_SR_CK enable to generate a voltage ramp in the same way as for the first voltage ramp.

The provided device enables to generate from one to a plurality of voltage ramps in programmable fashion.

At time t9, a new ramp generation cycle is for example started again with a reset cycle by activating signal RESET (reset voltage).

The example of FIG. 4 illustrates falling voltage ramps. It is however possible, for example by modifying voltage ramp synchronization signal RMP_SR_CK, to ascertain that switches 106 are controlled to generate a rising voltage ramp. When shift registers are used, the propagation direction is for example inverted. When an addressing system is used, then the order of occurrence of the addresses is for example inverted.

When the desired voltage ramp is falling, a reset sequence is for example implemented to set the ramp to a sufficiently high initial level, accurately.

Figure 5:
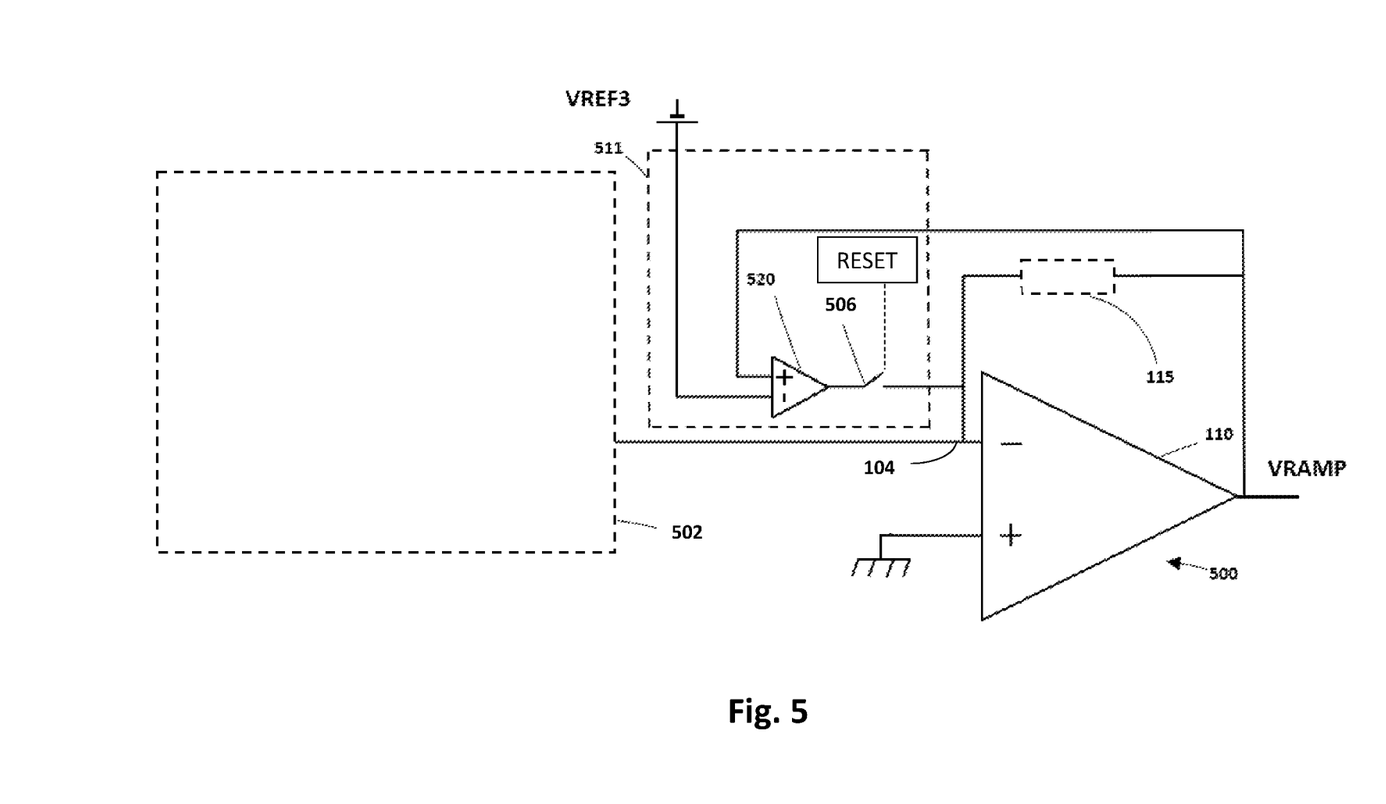
FIG. 5 schematically shows a digital-to-analog converter according to another embodiment of the present disclosure.

FIG. 5 schematically shows a digital-to-analog converter 500 according to another embodiment of the present disclosure, comprising certain elements in common with the generator 100 of FIG. 1. In the example of FIG. 5, a block 502 represents all the switches 106, all the capacitors 102, controller 108, clock signal 109, and external address 113, which are arranged in block 502 similarly to the example of FIG. 1. The digital-to-analog converter 500 of FIG. 5 is similar to that of FIG. 1, except for a reset circuit 511, the example of FIG. 5 showing a specific embodiment thereof. In FIG. 5, the − input of amplifier stage 110 corresponds to lead 104 of FIG. 1.

Reset circuit 511 for example comprises a switch 506 coupling the inverting input of amplifier stage 110 to the output of another amplifier 520, which plays the role of a first stage of a two-stage amplifier, the second stage being amplifier 110. The input, noted +, of amplifier 520 is for example coupled, preferably connected, to output VRAMP of amplifier 110. The input, noted −, of amplifier 520 is for example coupled, preferably connected, to a third reference voltage VREF3.

When switch 506 is on, amplifier 520 and amplifier 110 form a two-stage amplifier. At that time, VRAMP approximately takes the level of third reference voltage VREF3. The third reference voltage VREF3 is for example sufficiently high to allow the deployment of a ramp, for example, falling.

In the example of FIG. 4, the reset method is potentially slow since the reset voltage is low and this voltage then has to be raised by acting on the controller, and to be left to accurately settle, which slows down the execution. On the contrary, in the example of FIG. 5, the resetting is directly performed at a high voltage. There are thus less operations to be performed, and the settling time will be short, since it is directly started from the desired voltage level.

Figure 6:
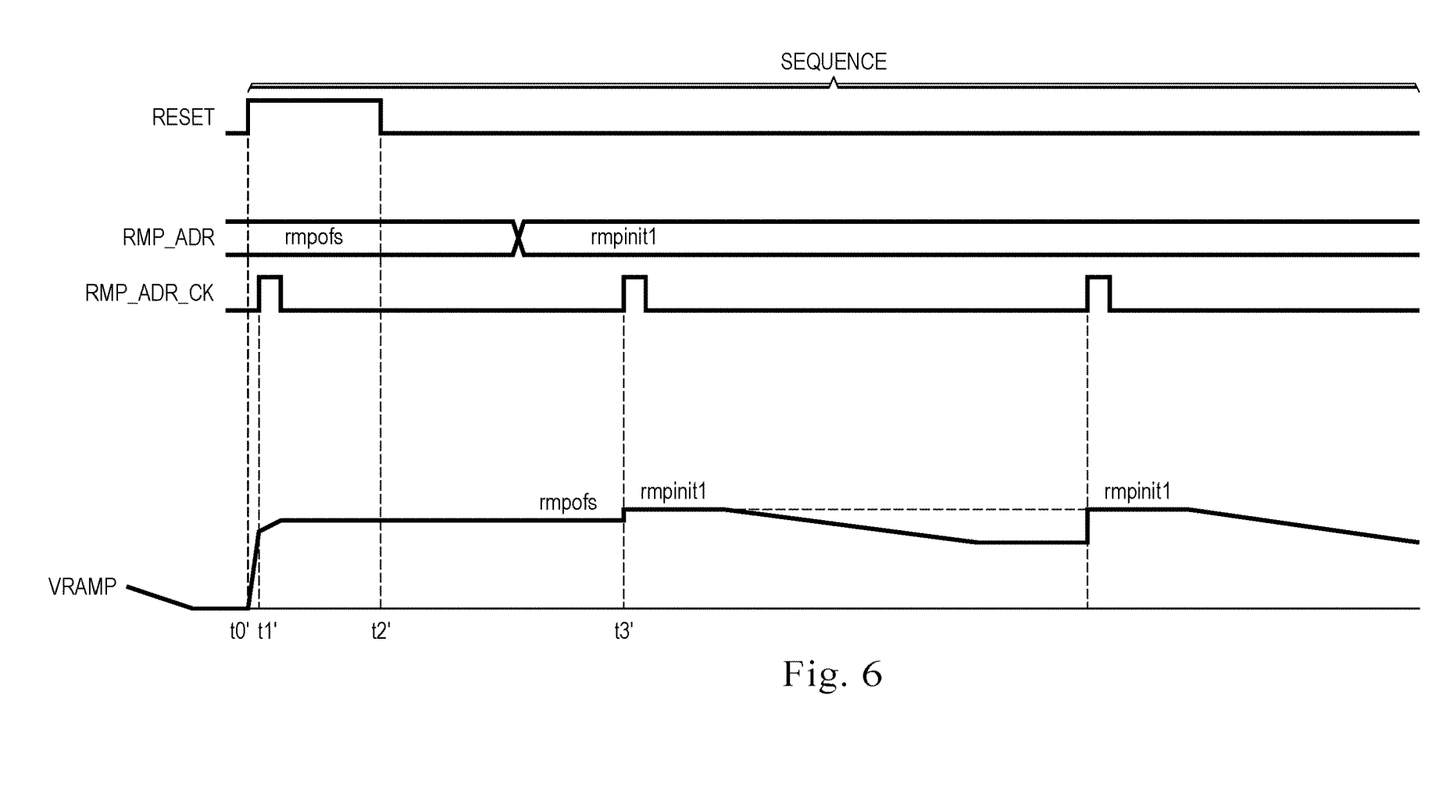
FIG. 6 is a flowchart illustrating examples of signals for the implementation of the generation of ramps and of voltage jumps with the digital-to-analog converter of FIG. 5.

FIG. 6 is a timing diagram illustrating examples of signals for the implementation of the generation of voltage ramps with the digital-to-analog converter of FIG. 5. FIG. 6 shows in particular examples of signal RESET, of address signal RMP_ADR, of address synchronization signal RMP_ADR_CK, and of voltage VRAMP.

At a first time t0', the rise of a reset signal RESET, applied to switch 506, is configured to generate the resetting of the output voltage of the ramp.

At a time t1', clock generator 109 sends, as an address synchronization signal RMP_ADR_CK, an address enable pulse programmable so that address value rmpofs is applied to a shift register in control circuit 108. This resets the state of this register before starting a new voltage ramp. At time t1 and until a time t2', switch 506 is for example set to its on state. This generates the resetting of the output voltage of the ramp in the approximate value of third reference voltage VREF3.

Applying address rmpofs enables to initialize capacitors 102 at the same time. This results in a shorter settling time to reach the voltage level associated with the application of address rmpofs. Indeed, the voltage step to be crossed is low, preferably zero. This enables to increase the execution speed. Further, a time gain is obtained since at the time of the resetting with the actuation of signal RESET, voltage VRAMP directly sets to the voltage level VREF3 corresponding to rmpofs. This enables to initialize, when they are present, comparators of the possible pixel array, without requiring an additional operation.

From time t3', the timing diagram of FIG. 6 for example corresponds to the timing diagram of FIG. 4 from time t3.

Various embodiments and variants have been described. Those skilled in the art will understand that certain features of these various embodiments and variants may be combined, and other variants will occur to those skilled in the art. For example, although embodiments of a digital-to-analog converter for ramp-type analog-to-digital converters have been described, the digital-to-analog converter may have other applications where a voltage ramp is used.

Finally, the practical implementation of the described embodiments and variations is within the abilities of those skilled in the art based on the functional indications given hereabove.

What is claimed is:

1. A digital-to-analog converter comprising:
    a plurality of first capacitors, each having a first electrode and a second electrode, wherein the second electrodes are connected together and are connected to an inverting input of a first amplifier stage having its non-inverting input coupled to ground;
    a plurality of first switches, each of the first capacitors having its first electrode connected to a corresponding one of the first switches,
    wherein each of the first switches is configured to:
        occupy a first state where the first electrode of a corresponding first capacitor is coupled to a first reference voltage, and
        occupy a second state where the first electrode of the corresponding first capacitor is coupled to a second reference voltage different from the first reference voltage;
    a capacitive feedback circuit connected between the inverting input and an output of the first amplifier stage, the capacitive feedback circuit comprising at least one second capacitor; and
    a controller configured to:
        control the plurality of first switches, and
        modify a charge accumulated in the capacitive feedback circuit and therefore generate a sequence comprising one or more voltage ramps at the output of the first amplifier stage.

2. The converter according to claim 1, further comprising:
    a reset circuit configured to reset the at least one second capacitor, the reset circuit connected to the inverting input and to the output of the first amplifier stage,
    wherein the reset circuit comprises a switch connected to the inverting input of the first amplifier stage, and
    wherein the output of the first amplifier stage is controlled by a reset voltage value when the switch of the reset circuit is on.

3. The converter according to claim 2, wherein the switch of the reset circuit is further connected to an output of a second amplifier, wherein the reset voltage is a third reference voltage applicable to an input of the second amplifier, and wherein an inverting input of the second amplifier is connected to the output of the first amplifier stage.

4. The converter according to claim 1, wherein the controller is configured to control the first switches one after another to progressively modify the charge accumulated at a level of the capacitive feedback circuit and therefore generate the one or more voltage ramps of the sequence.

5. The converter according to claim 1, wherein the controller comprises one or more shift registers configured to control the plurality of first switches.

6. The converter according to claim 1, wherein the controller is configured to simultaneously control the plurality of first switches in order to generate a voltage jump at the output of the first amplifier stage.

7. The converter according to claim 1, wherein a number of the first capacitors is greater than or equal to 2n, and wherein n is an integer greater than or equal to 6.

8. The converter according to claim 1, wherein the first capacitors have an equal or approximately equal capacitance.

9. The converter according to claim 1, wherein the controller is configured to select relative levels of the first and second reference voltages to select a positive slope or a negative slope of the one or more voltage ramps of the sequence.

10. The converter according to claim 1, wherein the controller further comprises addressing means for programmably controlling the plurality of first switches.

11. An image sensor comprising:
    a pixel array; and
    at least one digital-to-analog converter according to claim 1,
    wherein the at least one digital-to-analog converter is coupled to the pixel array.

12. A method for generating a sequence of one or more voltage ramps, the method comprising:
    controlling, by a controller, a plurality of first switches of a digital-to-analog converter,
    wherein the digital-to-analog converter comprises:
        a plurality of first capacitors, each having a first electrode and a second electrode,
        wherein the second electrodes are connected together and are connected to an inverting input of a first amplifier stage having its non-inverting input coupled to ground,
        wherein each of the first capacitors has its first electrode connected to a corresponding one of the first switches, and
        wherein each of the first switches is capable of occupying a first state where the first electrode of a corresponding first capacitor is coupled to a first reference voltage, and occupying a second state where the first electrode of the corresponding first capacitor is coupled to a second reference voltage different from the first reference voltage, and
        a capacitive feedback circuit comprising at least one second capacitor connected between the inverting input and an output of the first amplifier stage, and
    wherein the first switches are controlled in order to modify a charge accumulated in the capacitive feedback circuit and therefore in order to generate the sequence at the output of the first amplifier stage of the digital-to-analog converter.

13. The method according to claim 12, further comprising resetting, by a resetting circuit, the at least one second capacitor, wherein the resetting circuit is connected to the inverting input and to the output of the first amplifier stage, wherein the reset circuit comprises a switch connected to the inverting input of the first amplifier stage, and wherein the output of the first amplifier stage is controlled by a value of a reset voltage.

14. The method according to claim 13, wherein the switch of the reset circuit is further connected to an output of a second amplifier, wherein the reset voltage is a third reference voltage applied to an input of the second amplifier, and wherein an inverting input of the second amplifier is connected to the output of the first amplifier stage.

15. The method according to claim 12, wherein the first switches are controlled one after another to progressively modify the charge accumulated at a level of the capacitive feedback circuit and therefore to generate the one or more voltage ramps of the sequence.

16. The method according to claim 12, wherein the controller comprises one or more shift registers to control the plurality of first switches.

17. The method according to claim 12, wherein the controller simultaneously controls the plurality of first switches to generate a voltage jump at the output of the first amplifier stage.

18. The method according to claim 12, wherein a number of the first capacitors is greater than or equal to 2n, and wherein n is an integer greater than or equal to 6.

19. The method according to claim 12, wherein the first capacitors have an equal or approximately equal capacitance.

20. The method according to claim 12, wherein the controller selects relative levels of the first and second reference voltages to select a positive slope or a negative slope of the one or more voltage ramps of the sequence.

* * * * *